United States Patent [19]

Stahl et al.

[11] Patent Number: 4,502,022

[45] Date of Patent: Feb. 26, 1985

[54] SUPPORT FOR AN OSCILLATOR

[75] Inventors: André Stahl, Orsay; Daniel Munier, Torcy; André Bertrand, Chaville, all of France

[73] Assignee: Quartz & Electronique Alcatel, Asnieres, France

[21] Appl. No.: 480,159

[22] Filed: Mar. 29, 1983

[30] Foreign Application Priority Data

Mar. 30, 1982 [FR] France ............................ 82 05422

[51] Int. Cl.³ ........................ H03B 1/00; H03H 9/10
[52] U.S. Cl. .................................. 331/68; 310/351; 310/344; 361/417
[58] Field of Search ................. 331/62, 67, 68, 69, 331/105, 175, 187; 310/340, 341, 344, 346, 348, 351; 361/380, 399, 417, 428, 419

[56] References Cited

U.S. PATENT DOCUMENTS

| 1,875,324 | 9/1932 | Bower ................................ 310/351 |
| 2,644,904 | 7/1953 | Barry et al. ........................ 310/8.2 |
| 2,704,431 | 3/1955 | Steele ................................ 331/69 X |

FOREIGN PATENT DOCUMENTS

| 453600 | 12/1943 | Belgium . |
| 858055 | 11/1940 | France . |
| 0027293 | 3/1977 | Japan ..................................... 331/68 |

OTHER PUBLICATIONS

"Proceedings of the 27th Annual Frequency Control Symposium", Jun. 12–14, 1973, A Fast Warmup Quartz Crystal Oscillator, by Harold M. Greenhouse et al.

Primary Examiner—Eugene R. LaRoche
Assistant Examiner—Robert J. Pascal
Attorney, Agent, or Firm—Sughrue, Mion, Zinn, Macpeak and Seas

[57] ABSTRACT

Said oscillator support (1) is constituted by a connection base fitting (2) covered by a sealed hood (20), the oscillator (8) is suspended from a bracket (4) by a wire (5) and drawn towards the base fitting (2) by another wire (7) which is connected alternately to the base of the oscillator and to the base fitting at several fixing points. Such an oscillator is used mainly in satellite location beacons.

4 Claims, 5 Drawing Figures

FIG.3
FIG.4
FIG.5
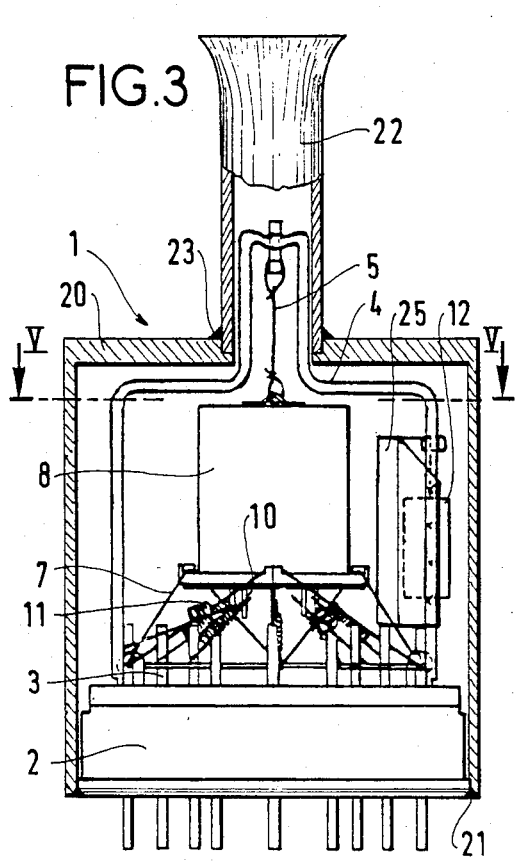
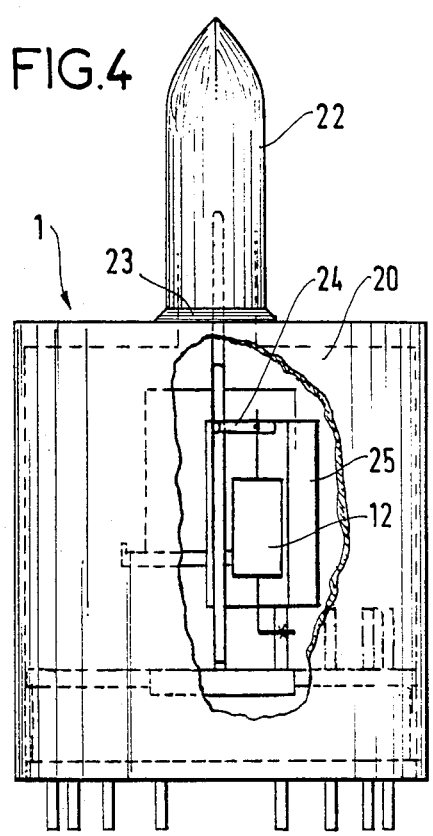
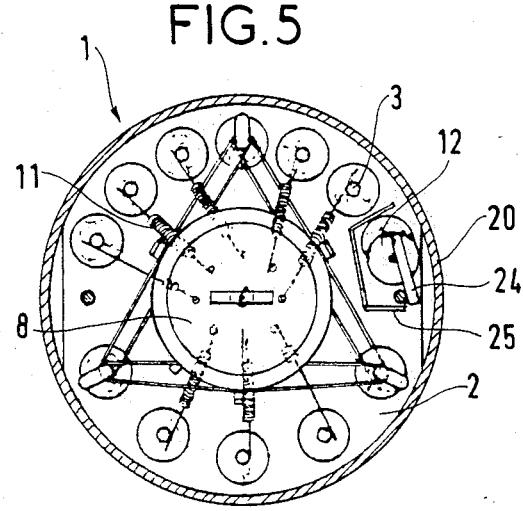

SUPPORT FOR AN OSCILLATOR

The present invention relates to an oscillator support constituted by a connection base fitting covered by a sealed hood. The support provides mechanical support and thermal insulation for an oscillator.

BACKGROUND OF THE INVENTION

Such oscillators may be used in beacons for satellite location, with the oscillator determining the beacon transmitter frequency. Such oscillators tend to be made in hybrid technology.

An oscillator must deliver a signal whose frequency is stable and therefore it must operate at a constant temperature which, in principle, should be its ideal operation temperature.

Further, it must withstand mechanical shocks which may be continuing sinusoidal vibrations of about 5 g, and also shocks of about 100 g which last for a few milliseconds when a beacon is dropped into the sea, for example.

To satisfy all these operating conditions, the oscillator is placed on a mechanical support and covered with a sealed hood.

Said mechanical support performs its mechanical insulation function properly, but known hoods are not good thermal insulators. Heat losses are due partly to conduction phenomena via the mechanical and electrical connections, partly to radiation phenomena (which can be reduced by forming polished surface conditions on the support e.g. by silver coating it), and mainly to convection phenomena which can be reduced by setting up a secondary vacuum of more than $10^{-4}$ torr inside the hood.

A substantially perfect vacuum can be set up by removing the residual gases by means of a gas absorber in the form of a pellet which has a high gas-absorption coefficient. The oscillator must also have a constant frequency as a function of time, i.e. good resistance to aging, low feed current consumption and a low production cost.

A paper by the communications division of Messrs. Bendix, read at the Proceedings of the 34th Annual Frequency Control Symposium USAERADCOM at Fort Monmouth, NJ 07703, in May, 1980, describes an oscillator support used in a satellite intended to be put in orbit. Said oscillator support is constituted by a first container in which the oscillator is suspended but not fixed at its base, said first container being drawn down towards a base fitting by wires which also serve as electric connections. A second container fixed on said base fitting encloses the first container. A secondary vacuum is set up between the two containers to avoid heat losses due to convection phenomena.

Said oscillator support is very complex and the use of two containers makes the support assembly heavier. Then, said support assembly does not dissociate its various functions from one another, namely, mechanical insulation and thermal insulation since the tight wires serve to maintain the first container and also act as electrical connections. The above mixing of functions does not provide optimum mechanical and electrical characteristics.

Preferred embodiments of the present invention remedy these drawbacks, providing an oscillator support which has only one sealed hood or container and having its mechanical and electrical functions performed by distinct means.

SUMMARY OF THE INVENTION

The present invention provides an oscillator support constituted by a connection base fitting covered by a sealed hood, wherein the oscillator is suspended from a bracket by a wire and drawn towards the base fitting by another wire which is connected alternately to the base of the oscillator and to the base fitting at a plurality of fixing points.

Preferably, the base of the oscillator has electric output terminals connected to connection terminals of the base fitting by spiral wound wires which are not very good heat conductors.

BRIEF DESCRIPTION OF THE DRAWINGS

An oscillator support in accordance with the invention is described hereinafter by way of example and with reference to the figures of the accompanying drawings in which:

FIG. 3 is a partial cross-section view of the entire support showing a hood and its sprue;

FIG. 4 is a side view of the support with hood partially cut away; and

FIG. 5 is a cross-section view looking down along a line V—V of FIG. 3.

DESCRIPTION OF THE PREFERRED EMBODIMENT

Figure 1:
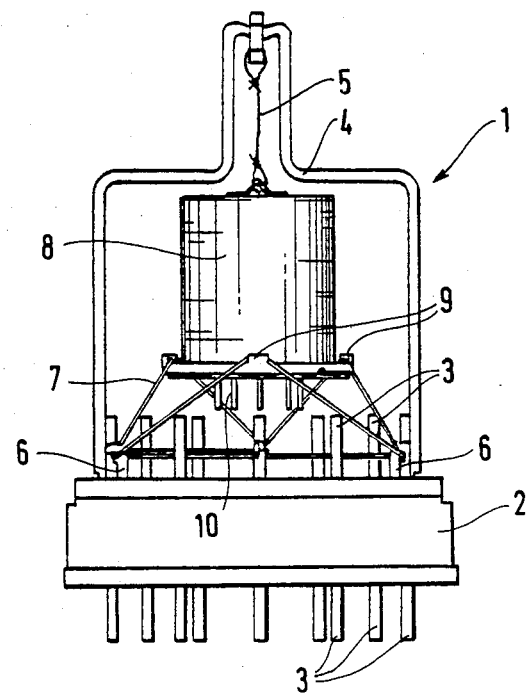
FIG. 1 is an elevation of the mechanical support of an oscillator.

In FIG. 1, connection terminals 3 pass through the base fitting 2 of a support 1. A metal suspension wire 5 is fixed on a bracket 4 and a metal wire 7 is fixed on hooks 6. The oscillator 8 is therefore held in place by the wire 5 and by the wire 7 which passes alternately on hooks 9 of the oscillator's base and on the hooks 6 of the base fitting 2.

Figure 2:
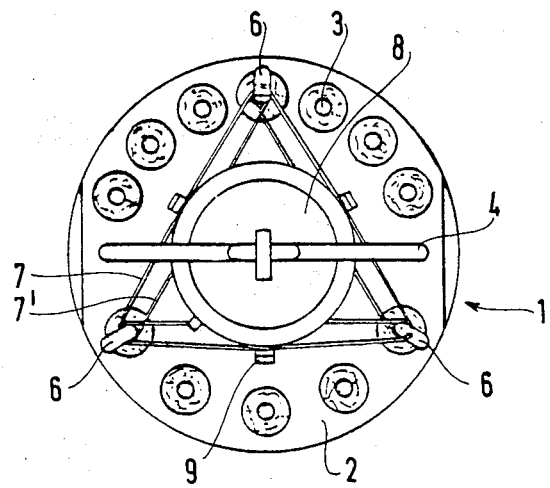
FIG. 2 is a top view of the support shown in FIG. 1.

FIG. 2 shows more particularly the geometrical configuration of the connection terminals 3 on the base fitting 2 and the path along which a horizontal loop 7' of the metal wire 7 passes around the three hooks 6 of the base fitting 2 after following a zig-zag path going alternately to a hook 9 and to a hooks 6.

Besides the mechanical structure of the support, FIG. 3 shows electric connections 11 in the form of spiral wound wires electrically soldered or welded firstly to electric output terminals 10 of the oscillator 8 and secondly to the connection terminals 3 of the base fitting 2. A gas adsorber 12 in the form of a pellet of substance having a high gas adsorption coefficient is fixed firstly to the bracket 4 by a small bar 24 and secondly to a connection terminal 3 of the base fitting 2. Before complete closure of the support, said pellet is activated at a temperature of about 500° C.; the oscillator is therefore protected by a screen 25 fixed to the bracket 4. A hood 20 is fixed onto the base fitting by a weld 21 which can be an argon arc (TIG) weld. A sprue 22 is fixed on the hood by brazing at 23. Said sprue may be made of copper melted in a vacuum. In serves to connect a vacuum pump to the hood. To begin with the end piece of said sprue is cylindrical and as soon as the required degree of vacuum is reached and the gas adsorber is activated, the hood is closed by pinching the end of the sprue which then has a shape clearly illustrated in FIGS. 3 and 4.

FIG. 5 shows the position of a screen 25 which protects the oscillator 8.

Without going beyond the scope of the invention, said oscillator support can be used in other applications which make use of high-stability oscillators.

We claim:

1. An oscillator support comprising a connection base fitting, a hood covering said base fitting and being sealably mounted thereto, the improvement comprising a bracket mounted on said base fitting within said hood, a first wire suspending an oscillator from said bracket above said base fitting, and a second wire connected alternately at spaced positions about said base fitting to the base fitting and to the base of the oscillator at a plurality of fixing points for drawing said oscillator towards said base fitting.

2. An oscillator support according to claim 1, wherein the base fitting has connection terminals passing therethrough and extending upwardly from said base fitting internally of said hood, the base of said oscillator includes electric output terminals projecting downwardly therefrom, and wherein spiral wound wires which are not very good heat conductors interconnect the connection terminals of the base fitting to the electric output terminals of said oscillator.

3. An oscillator support according to claim 1, further including within said hood and adjacent said oscillator, a gas adsorber to remove residual gases.

4. An oscillator support according to claim 1, wherein a sprue is welded to the hood for allowing a vacuum pump to be connected thereto and wherein the end of the sprue remote from the hood is pinched off to close the hood once a vacuum is set up therein.

* * * * *